United States Patent
Cho et al.

(10) Patent No.: US 10,259,704 B2
(45) Date of Patent: Apr. 16, 2019

(54) NANOPILLAR-BASED ARTICLES AND METHODS OF MANUFACTURE

(71) Applicant: Regents of the University of Minnesota, Minneapolis, MN (US)

(72) Inventors: Jeong-Hyun Cho, Woodbury, MN (US); Chao Liu, Heilongjiang Province (CN); Seung Yeon Lee, Minneapolis, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 50 days.

(21) Appl. No.: 15/482,409

(22) Filed: Apr. 7, 2017

(65) Prior Publication Data

US 2017/0294699 A1 Oct. 12, 2017

Related U.S. Application Data

(60) Provisional application No. 62/319,652, filed on Apr. 7, 2016, provisional application No. 62/320,107, filed on Apr. 8, 2016.

(51) Int. Cl.
  *B82B 3/00* (2006.01)
  *H01B 1/02* (2006.01)
  (Continued)

(52) U.S. Cl.
  CPC ............. *B82B 3/0014* (2013.01); *G02B 6/00* (2013.01); *H01B 1/02* (2013.01); *H01P 1/2005* (2013.01);
  (Continued)

(58) Field of Classification Search
  CPC .......... B82B 3/0014; G02B 6/00; H01B 1/02; B81B 2203/0361; Y10S 977/81; Y10S 977/932; H01P 7/08
  (Continued)

(56) References Cited

U.S. PATENT DOCUMENTS 7,273,732 B2    9/2007    Pan et al.
7,935,599 B2    5/2011    Crowder et al.
(Continued)

FOREIGN PATENT DOCUMENTS

CN    101556889 B    6/2010
CN    104040705 A    9/2014
(Continued)

OTHER PUBLICATIONS

Chen et al., Terahertz Metamaterial Devices Based on Graphene Nanostructures, IEEE Transactions on Terahertz Science and Technology, vol. 3, No. 6, Nov. 2013, pp. 748-756.*
(Continued)

*Primary Examiner* — Benny T Lee
*Assistant Examiner* — Hafizur Rahman
(74) *Attorney, Agent, or Firm* — Dicke, Billig & Czaja, PLLC

(57) ABSTRACT

Nanopillar-based THz metamaterials, such as split ring resonator (SRR) MMs, utilizing displacement current in the dielectric medium between nanopillars that significantly increases energy storage in the MMs, leading to enhanced Q-factor. A metallic nanopillar array is designed in the form of a single gap (C-shape) SRR. Vacuum or dielectric materials of different permittivities are filled between the nanopillars to form nanoscale dielectric gaps. In other embodiments, formation of patterned nanowires using anodic aluminum oxide (AAO) templates with porous structures of different heights resulting from an initial step difference made by etching the aluminum (Al) thin film with a photoresist developer prior to the anodization process are disclosed.

18 Claims, 13 Drawing Sheets

(51) Int. Cl.
 *G02B 6/00* (2006.01)
 *H01P 1/20* (2006.01)
(52) U.S. Cl.
 CPC ..... *B81B 2203/0361* (2013.01); *Y10S 977/81* (2013.01); *Y10S 977/932* (2013.01)
(58) Field of Classification Search
 USPC ......................................................... 333/219
 See application file for complete search history.

(56) References Cited

U.S. PATENT DOCUMENTS

| | | | |
|---|---|---|---|
| 8,488,247 | B2 | 7/2013 | Cai et al. |
| 8,599,489 | B2 | 12/2013 | Shalaev et al. |
| 8,748,940 | B1 | 6/2014 | Rachmady et al. |
| 8,803,637 | B1* | 8/2014 | Peralta .................. H01P 7/082 333/204 |
| 2011/0287218 | A1* | 11/2011 | Narimanov ............ G02B 1/002 428/141 |
| 2013/0220821 | A1 | 8/2013 | Cho et al. |
| 2014/0017480 | A1 | 1/2014 | Park et al. |
| 2015/0228480 | A1 | 8/2015 | Yin et al. |
| 2016/0170098 | A1* | 6/2016 | Ivanovich ............. G02B 1/007 359/241 |

FOREIGN PATENT DOCUMENTS

| | | |
|---|---|---|
| CN | 104049112 A | 9/2014 |
| CN | 104576783 A | 4/2015 |
| CN | 104600196 A | 5/2015 |
| JP | 5270065 B2 | 8/2013 |
| JP | 2013201004 A | 10/2013 |
| KR | 20130066268 A | 6/2013 |
| KR | 101320870 B1 | 10/2013 |
| KR | 101337267 B1 | 12/2013 |
| KR | 101554927 B1 | 9/2015 |
| WO | 2012002794 A1 | 1/2012 |
| WO | 2012064177 A1 | 5/2012 |
| WO | 2012074367 A1 | 6/2012 |
| WO | 2012081965 A1 | 6/2012 |
| WO | 2014200431 A1 | 12/2014 |
| WO | 2015021255 A1 | 2/2015 |

OTHER PUBLICATIONS

Anandan et al., "Nanopillar array structures for enhancing bio sensing performance", International Journal of Nano medicine 2006:1(1) pp. 73-79.*
Lim et al., "Micro and nanotechnology for biological and biomedical applications", Med Biol Eng Comput (2010)48:941-943.
Grenier et al., "Resonant based Microwave Biosensor for Biological Cells Discrimination", Radio and Wireless Symposium (RWS), pp. 523-526 (2010).
Urban, "Micro- and nanobiosensors-state of the art and trends", Measurement Science and Technology, 20 (2009) 012001.
El-Ali et al., "Cells on chips", Nature, vol. 442, pp. 403-411 (Jul. 27, 2006).
Fritz et al., "Translating Biomolecular Recognition into Nanomechanics", Science, vol. 288, pp. 316-318 (Apr. 14, 2000).
Arlett et al., "Comparative advantages of mechanical biosensors", Nature Nanotechnology, vol. 6, pp. 203-215 (Apr. 2011).
Luo et al., "Electrical biosensors and the label free detection of protein disease biomarkers", Chem Soc Rev, 42, 5944-5962 (2013).
Vo-Dinh et al., "Biosensors and biochips: advances in biological and medical diagnostics", Fresenius J Anal Chem (2000) 366:540-551.
Menikh et al., "Terahertz Biosensing Technology: Frontiers and Progress", ChemPhysChem (2002) 3(8), 655-658.
O'Hara et al., "Thin-film sensing with planar terahertz metamaterials: sensitivity and limitations", Optics Express, vol. 16, No. 3, pp. 1786-1795 (Feb. 4, 2008).
Park et al., "Detection of mciroorganisms using terahertz metamaterials", Scientific Reports, 4:4988, pp. 1-7 (May 16, 2014).
Abduljabar et al., "Novel Microwave Microfluidic Sensor Using a Microstrip Split-Ring Resonator", IEEE Transactions on Microwave Theory and Techniques, vol. 62, No. 3, pp. 679-688 (Mar. 2014).
Fedotov et al., "Sharp Trapped-Mode Resonances in Planar Metamaterials with a Broken Structural Symmetry", Physical Review Letters, 99(14), 147401 (Oct. 5, 2007).
Tsakmakidis et al., "Negative-permeability electromagnetically induced transparent and magnetically active metamaterials", Physical Review B, 81(19), 195128 (2010).
Jansen et al., "Terahertz metasurfaces with high Q-factors", Applied Physics Letters, 98(5), 051109 (2011).
Al-Naib et al., "Ultra-high Q even eigenmode resonance in terahertz metamaterials", Applied Physics Letters, 106(1), 011102 (2015).
Naqui et al., "Transmission Lines Loaded With Bisymmetric Resonators and Their Application to Angular Displacement and Velocity Sensors", IEEE Transactions on Microwave Theory and Techniques, vol. 61, No. 12, 4700-4713 (Dec. 2013).
Lu et al., "Semiconductor nanowires", J. Phys. D: Appl. Phys. 39 (2006) R387-R406.
Yang et al., "Semiconductor Nanowire: What's Next?", Nano Letters (2010), 10, 1529-1536.
Dasgupta et al., "25th Anniversary Article: Semiconductor Nanowires—Synthesis, Characterization, and Applications", Advanced Materials (2014), 26, 2137-2184.
Kawano et al., "Fabrication and properties of ultrasmall Si wire arrays with circuits by vapor-liquid-solid growth", Sensors and Actuators A 97-98 (2002) 709-715.
Ishida et al., "A Si nano-micro-wire array on a Si(111) substrate and field emission device applications", Superlattices and Microstructures 34 (2003) 567-575.
Poinem et al., "Progress in Nano-Engineered Anodic Aluminum Oxide Membrane Development", Materials 2011, 4, 487-526.
Huanga et al., "Observation of isolated nanopores formed by patterned anodic oxidation of aluminum thin films", Applied Physics Letters 88, 233112 (2006).
Jee et al., "Fabrication of Microstructures by Wet Etching of Anodic Aluminum Oxide Substrates", Chem. Mater. 2005, 17, 4049-4052.
Patolsky et al., "Fabrication of silicon nanowire devices for ultrasensitive, label-free, real-time detection of biological and chemical species", Nature Protocols, vol. 1, No. 4, 2006, 1711-1724.
Adachi et al., "Core-shell silicon nanowire solar cells", Scientific Reports, 3 : 1546, Mar. 26, 2013, pp. 1-6.
Goldberger et al., "Silicon Vertically Integrated Nanowire Field Effect Transistors", Nano Letters, vol. 6, No. 5, pp. 973-977 (2006).
Nadeem et al., "Fabrication of Microstructures Using Aluminum Anodization Techniques", Proc. 11th int. Microelectromech. Syst., 274-277 (1998).
Lee et al., "Patterning Anodic Porous Alumina with Resist Developers for Patterned Nanowire Formation", Mater. Res. Soc. Symp. Proc. vol. 1785 (2015) pp. 13-19.
Nalwa, Hari Singh, ed. Handbook of Nanostructured Biomaterials and Their Applications in Nanobiotechnology: Biomaterials. 1. vol. 1 American Scientific Publishers, 2005, pp. 280-282 and 481.
Elliott R.S., Electromagnetics: History[J]. Theory, and Applications (New York: IEEE) (1993) pp. 256-325 and 467-511.
El-Haggar, ed. "Sustainable Industrial Design and Waste Management", p. 189 (2007).
Liu et al., "Displacement Current Mediated Resonances in Terahertz Metamaterials", Adv. Optical Mater. 2016, 4, 1302-1309.

* cited by examiner

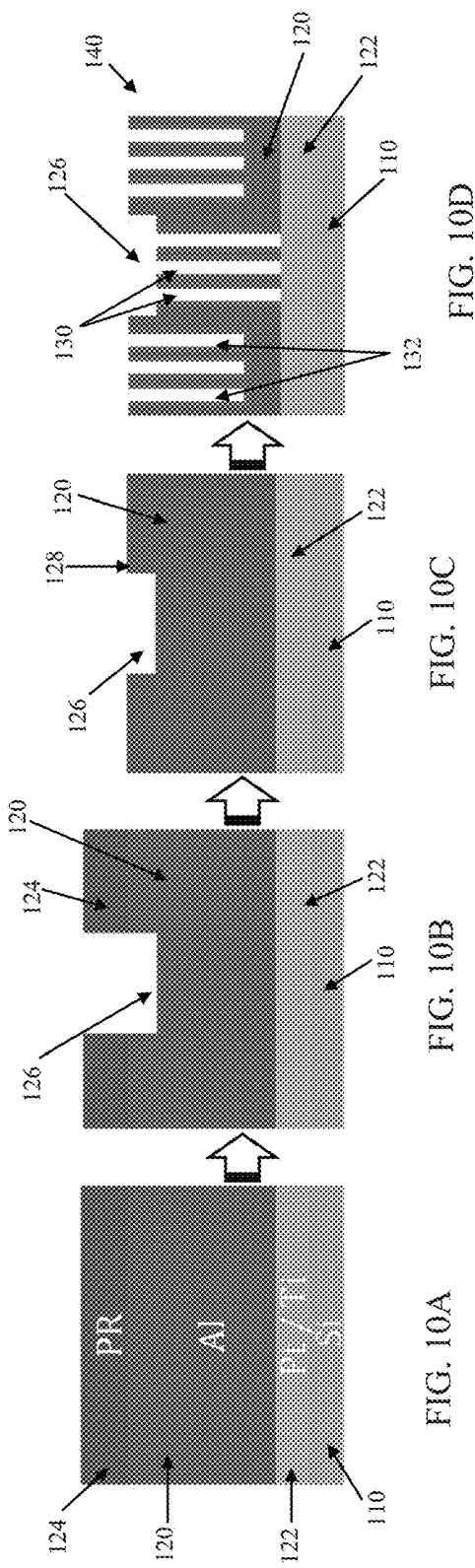

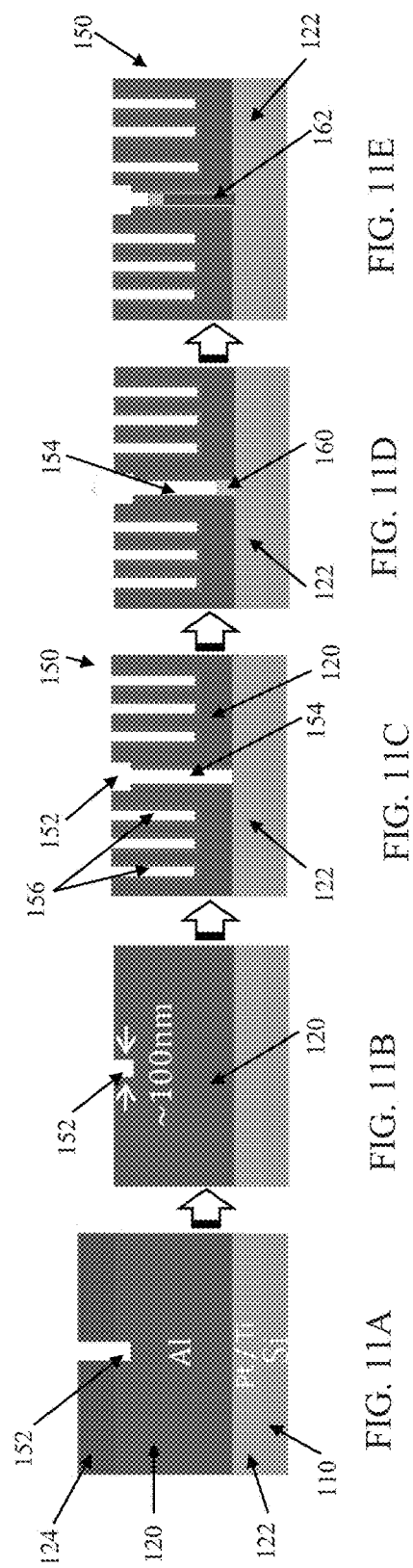

SRR MMs with 10 nm $Al_2O_3$ gaps ($\varepsilon = 9.8$)

SRR MMs with 10 nm air gaps ($\varepsilon = 1$)

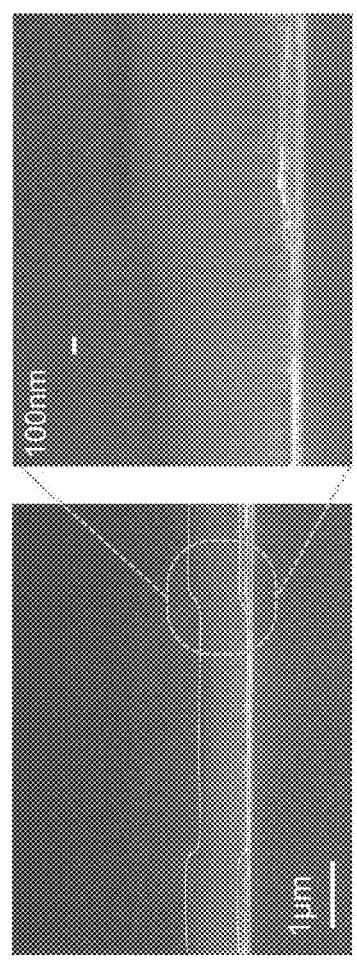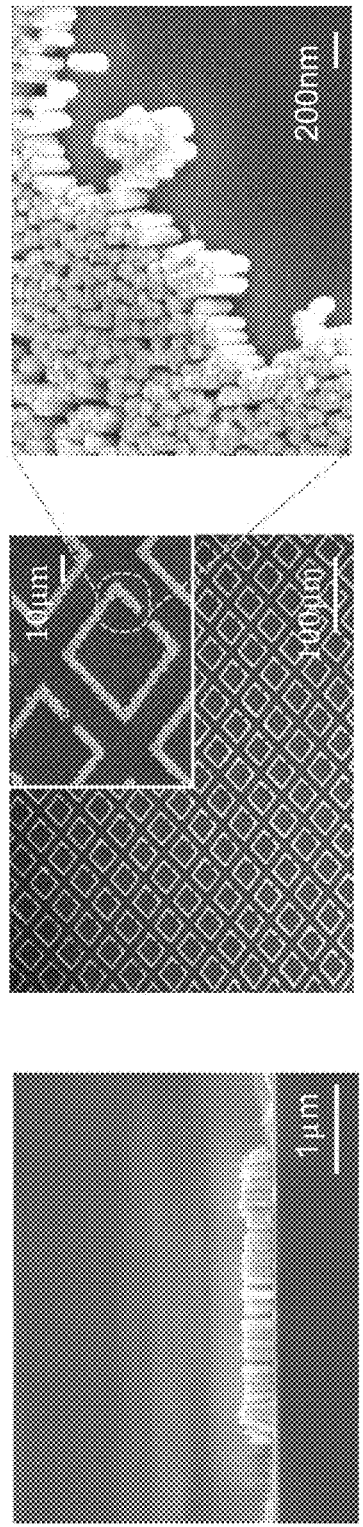
FIG. 17A
FIG. 17B
FIG. 17C
FIG. 17D

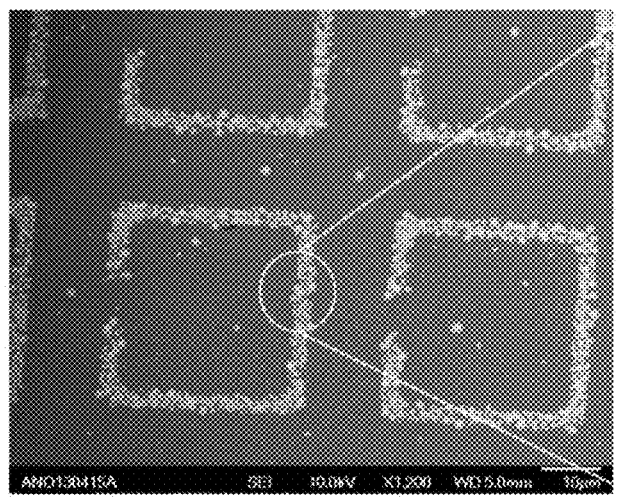 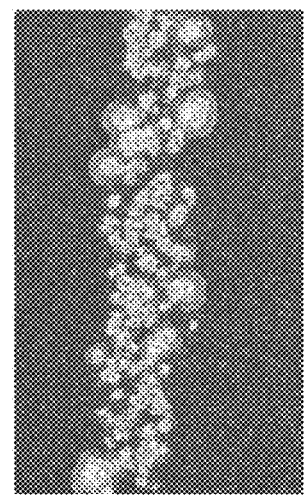
FIG. 18A                    FIG. 18B
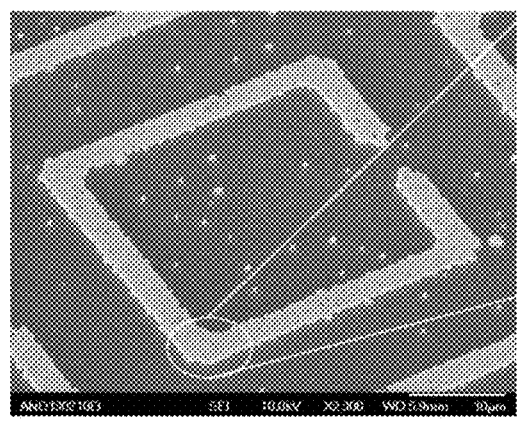 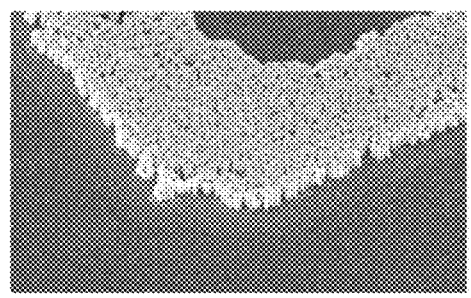
FIG. 19A                    FIG. 19B

NANOPILLAR-BASED ARTICLES AND METHODS OF MANUFACTURE

CROSS-REFERENCE TO RELATED APPLICATIONS

This Non-Provisional Patent Application claims the benefit of the filing dates of U.S. Provisional Patent Application Ser. No. 62/319,652, filed Apr. 7, 2016, entitled "Methods for Forming One or More Vertically Aligned Nanowires," and U.S. Provisional Patent Application Ser. No 62/320,107, filed Apr. 8, 2016, entitled "Nanopillar-Based Terahertz Metamaterials Utilizing Displacement Current," the entire teachings of each of which are incorporated herein by reference.

BACKGROUND

The present disclosure relates to articles incorporating nanopillars or nanowires, such as terahertz metamaterials, and methods of manufacture. More particularly, some aspects relates to high quality-factor terahertz metamaterials, such as micro-scale split ring resonators, as well as a resonant behavior induced by a displacement current that can be utilized with the terahertz metamaterials. Other aspects relate to methods for manufacturing such terahertz metamaterials as well as other nanopillar or nanowire articles.

Terahertz metamaterials (THz MMs) are good candidates as sensors for the detection of chemicals and biomaterials, temperature, strain, alignment, and position. THz MMs can also be used as frequency-agile devices by adding a dielectric material around the MMs. The sensing resolution and frequency selectivity of the MMs depends on their quality factors (Q-factors) because high Q-factors mean the MMs have sharp resonant responses, allowing detection of small frequency shifts induced by substances around the MMs. Even though THz MMs show great promise for sensing and tunable devices, their relatively low Q-factors (typically below 20 of single-ring resonator MMs) compared to micro- and nanoscale mechanical resonators (typically between $10^4$ and $10^7$) impose limitation on their sensitivity.

One of the approaches to increase the Q-factor of MMs is to reduce the energy losses of MMs and substrates by optimizing the material properties and structures of the MMs. There are typically three main energy loss mechanisms: Ohmic loss of MMs, dielectric loss of the substrate, and radiation loss of MMs. The most common method to increase Q-factor of MMs without changing material properties is to design asymmetric split resonators (ASRs) by breaking the symmetry of the MMs. The asymmetric design reduces the radiation loss of the resonator and can increase the Q-factor up to 30. Another method uses coupling between MMs in a super unit to excite both odd and even modes of the MMs. This approach can improve the Q-factor by a factor of 5 compared to typical film-based MMs. However, the Q-factor of THz MMs needs to be further enhanced (10 to 20 times) to meet the requirement of ultra-sensitive sensors.

Another factor that measures the sensitivity of MM sensors is how much the resonant frequency shift in the transmission spectrum when permittivities of the adjacent medium change. Modern detection techniques require sensors to have the ability to detect a very small quantity of substances, even single molecules. However, it is extremely difficult to achieve such a high sensitivity using typical film-based MM sensors because the response to changes of substance, in the form of small resonant frequency changes, can be hard to detect, especially when the volume or concentration of the substance around the MMs is not high enough. In order to develop sensors that can detect minute concentration of substances, large resonant frequency change in response to the change of the substance around the MMs is one of the key requirements.

SUMMARY

The inventors of the present disclosure recognized that a need exists for high Q-factor THz MMs designs, and corresponding fabrication methods that overcome one or more of the above-mentioned problems. The inventors of the present disclosure further recognized that a need exists for improved methods of fabricating nanowires (or nanopillars).

Some aspects of the present disclosure are directed toward a nanopillar-based THz split ring resonator (SRR) MMs, utilizing displacement current in the dielectric medium between nanopillars that significantly increases energy storage in the MMs, leading to, in some embodiments, enhanced Q-factor up to about 450 (30 times higher than that of typical thin-film-based MMs). A metallic nanopillar array is designed in the form of a single gap (C-shape) SRR. Vacuum or dielectric materials of different permittivities are filled between the nanopillars to form nanoscale dielectric gaps. The size of the dielectric gaps can vary from a few nanometers up to tens of nanometers. Since the use of nanopillars offers large surface areas, the total electric charge separation (+q and −q) on the collective surfaces increases, resulting in the increase of electrostatic energy stored in the MMs, which leads to significantly enhanced Q-factor. In addition, dielectric nanogaps reduce the Ohmic loss generated by the current circulating in the metal conductor, thus the total energy loss of MMs is reduced, which further enhances the Q-factor of the MMs. In some embodiments, high Q-factor, for example at least 300 and up to about 450 in some non-limiting embodiments, can be observed in the nanopillar-based SRR MMs of the present disclosure, which means they are much more sensitive than typical thin-film-based MMs.

With embodiments of the present disclosure, resonant frequency shifts resulting from exposure to substances with different permittivities are much larger for nanopillar-based MMs (e.g., on the order of 17 times larger in some embodiments) than for typical thin-film-based MMs. When the same amount of substance is applied to the MMs, embodiments of the nanopillar-based MMs of the present disclosure have more effective structures involved compared to typical film-based MMs because nanopillars enormously increase the surface area of the MMs. This leads to larger frequency shift, resulting in highly sensitive sensors as well as enhanced tunability of frequency-agile MM devices. The nanopillar-based terahertz MMs of the present disclosure can be useful, for example, as sensors for chemical, biological, temperature, strain and position sensing.

Other aspects of the present disclosure relate to methods for fabricating SRRs that include forming nano scale gaps between each gold (or other metal) nanopillar without using E-beam lithography.

Yet other aspects of the present disclosure are directed toward a novel fabrication process which adopts two properties of resist developers; namely, developing a resist layer and etching metals. Some methods of the present disclosure for patterning porous structures of AAO also allows fabrication of a single vertically oriented semiconductor nanowire on a metal substrate which is extremely hard to accomplish with current technology. In some embodiments, the methods of the present disclosure not only reduce the cost and time to fabricate patterned nanowires using patterned porous AAO templates, but also allow fabrication of a single metal or semiconductor nanowire on a metal substrate which, in turn, can be incorporated in a circuit.

Formation of patterned metal and semiconductor (e.g. silicon) nanowires, for example, can be achieved using anodic aluminum oxide (AAO) templates with porous structures of different heights resulting from an initial step difference made by etching the aluminum (Al) thin film with a photoresist developer prior to the anodization process. This approach allows for the growth of vertically aligned nanowire arrays on a metal substrate, instead of an oriented semiconductor substrate, using an electroplating or a chemical vapor deposition (CVD) process. The vertically aligned metal and semiconductor nanowires defined on a metal substrate could be applied to the realization of vertical 3D transistors, field emission devices, or nano-micro sensors for biological applications. The density of the nanowire(s) can also be controlled.

BRIEF DESCRIPTION OF THE DRAWINGS

FIGS. 10A-10D schematically illustrate a method for fabricating an AAO template in accordance with principles of the present disclosure and useful with methods for fabricating vertically aligned nanowires, such as nanopillars, in accordance with principles of the present disclosure;

FIGS. 11A-11E schematically illustrate a method for fabricating a single nanowire in accordance with principles of the present disclosure;

FIG. 17A is an SEM image of an AAO template described in the Examples section;

FIGS. 17B-17D are SEM images of patterned Au nanowires described in the Examples section and prepared using the AAO template of FIG. 17A;

FIG. 18A is an SEM image of a nanopillar MM described in the Examples section;

FIG. 18B is a magnified image of a portion of FIG. 18A;

FIG. 19A is an SEM image of a nanopillar MM described in the Examples section;

FIG. 19B is a magnified image of a portion of FIG. 19A; and

DETAILED DESCRIPTION

Nanopillar-Based MM Devices

Figures 2A, 2B:
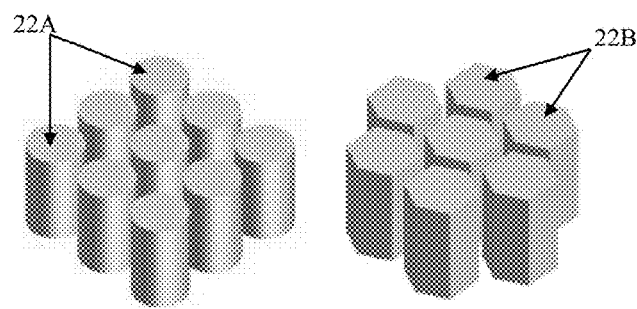
FIGS. 2A and 2B schematically illustrate alternative nanopillars in accordance with principles of the present disclosure.
Figures 3A, 3B, 3C:
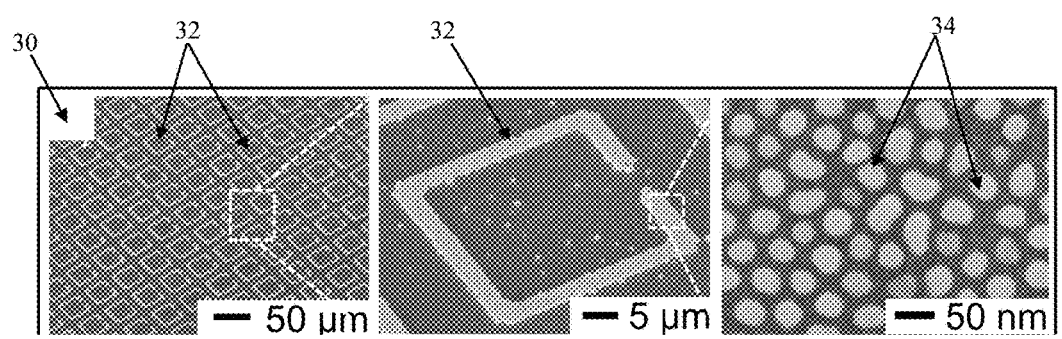
FIGS. 3A-3C are SEM images of a circular nanopillar-based SRR array in accordance with principles of the present disclosure.

Some aspects of the present disclosure are directed to THz MMs incorporating nanopillars and utilizing displacement current driving their resonant frequencies. One non-limiting category of nanopillar-based THz MM devices of the present disclosure is nanopillar-based resonators such as nanopillar-based SRRs. Other resonator shapes, such as an O-shaped or □-shaped (e.g., square shaped) resonator, are also acceptable. With this in mind, a non-limiting example of a square nanopillar-based SRR 20 in accordance with principles of the present disclosure is shown schematically in FIGS. 1A-1C. The SRR 20 is formed by a multiplicity (e.g., thousands) of nanopillars 22, and can be optionally be fabricated onto a substrate 24 (e.g., silicon substrate) using a template, such as an anodic aluminum oxide template as described below. The geometry and material property of the SRR are defined by height H, width l, interface area A, nanogap size d and permittivity ε identified in FIG. 1C. The nanopillars 22 are preferably identical, and can be formed of an appropriate, electrically conductive material (e.g., metal) such as gold, platinum, etc. While the nanopillars 22 are shown as having a square cylinder shape, other shapes are also acceptable, such as circular, hexagon, etc. (as reflected by the alternative nanopillars 22A and 22B of FIGS. 2A and 2B, respectively). FIG. 3A is an SEM images of one embodiment of an array 30 of nanopillar-based SRRs 32 formed on a silicon substrate in accordance with principles of the present disclosure. As shown in the magnified views of FIGS. 3B and 3C, each SRR 32 is formed by thousands of platinum nanopillars 34 fabricated, for example, using an anodic aluminum template. Various methods are contemplated by the present disclosure for fabricating the nanopillars on a substrate; for example, in some non-limiting embodiments, the nanopillars are fabricated via a formed anodic aluminum oxide template as described below.

Figures 4A, 4B:
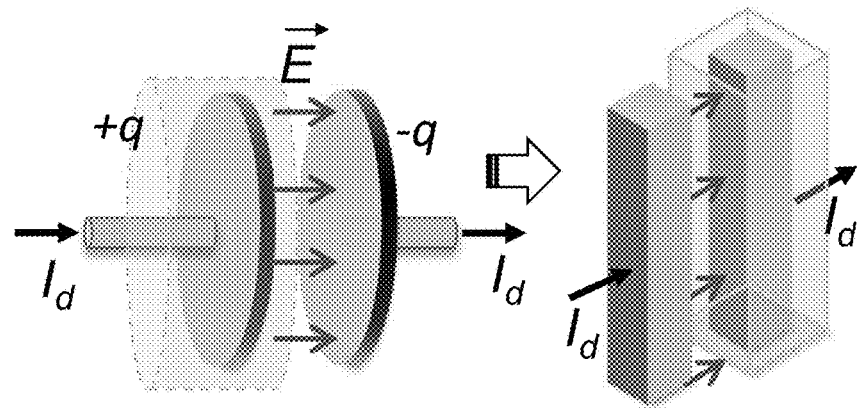
FIG. 4A schematically illustrates displacement current induced between two conducting plates.
FIG. 4B schematically illustrates displacement current induced between two metallic nanopillars.

In some embodiments of the present disclosure, resonance in the nanopillar-based SRR MMs is driven by displacement current, which is typically defined as the flux integral of the time derivative in the displacement field. The displacement current cannot be interpreted as actual current that is driven by moving charges in a conductor, but it shares the same characteristics as actual current and is associated with the magnetic field around it. A typical example is a capacitor configured with two parallel conducting plates as shown in FIG. 4A. Changing the amount of separated charge (+q and −q) on the surfaces of the two parallel plates generates time-dependent electric fields between the plates, leading to a displacement current ($I_d$) across the plates. The same concept can be applied to nanopillar arrays as represented by FIG. 4B. When electromagnetic waves are applied to nanopillar arrays with small enough gaps between nanopillars, a transient electric field is induced between the nanopillars. The changing electric field acts exactly like current, called displacement current, flowing through the nanopillars and forming a current loop along C-shaped SRR MMs (e.g., as shown in FIGS. 1A and 3B) made from the nanopillar array.

Figures 1A, 1B, 1C:
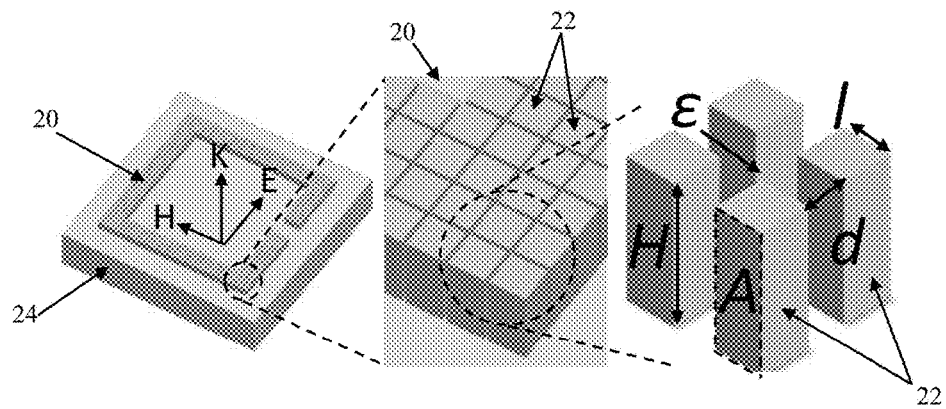
FIGS. 1A-1C schematically illustrate a THZ MM in accordance with principles of the present disclosure and including a multiplicity of nanopillars.
Figure 5:
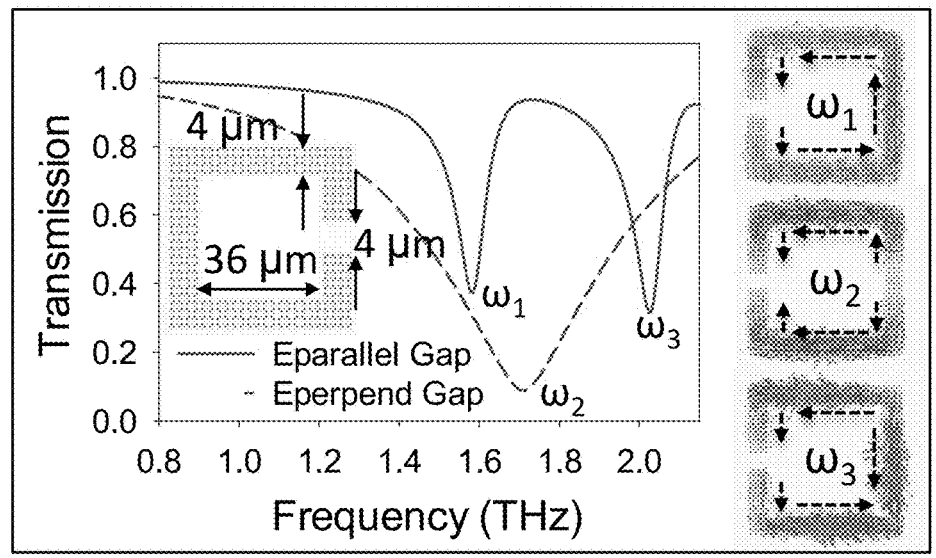
FIG. 5 is a graph of simulated transmission spectra of a nanopillar-based SRR and surface current distribution of first three resonant modes in accordance with principles of the present disclosure.

By way of example, the displacement current effect was considered relative to the SRR construction of FIGS. 1A-1C. The rectangular nanopillars 22 were selected to demonstrate resonant behaviors induced by displacement current in SRRs. The rectangular nanopillars 22 with nanoscale spacings (nanogaps) are patterned to collectively form the C-shaped SRR 20 on a substrate (e.g., the silicon substrate 24). When a terahertz pulse transmits through the SRR plane under normal incident with the electric field E along one of the edges of SRR as identified in FIG. 1A, it induces transient charges (+q and −q) on the surfaces of the nanopillars 22 and a time varying displacement current $I_d$ between the nanopillars as represented by FIG. 4B. Finally, all these displacement currents along the C-shaped SRR 20 mimic a circulating current as shown in FIG. 5, similar to that observed in a thin metallic SRR. As a point of reference, FIG. 5 provides simulated transmission spectra of a nanopillar-based SRR of the present disclosure (with split size of 4 μm, SRR length of 36 μm, and SRR arm width of 4 μm) and the surface current distributions at the first three resonant frequencies. First mode ($\omega_1$) and third mode ($\omega_3$) of the SRR are for the electric field parallel to the split, while second mode ($\omega_2$) is for the electric field perpendicular to the split. The circular current flowing through the nanopillar-based SRR results in an accumulation of electric charges at the split of the SRR, which in turn generates an electric field in the split in the direction opposite to the circular current, leading to electric energy being stored at the split and magnetic energy being stored in the SRR arms. Therefore, the external electromagnetic field couples to the nanopillar-based SRR 20 and excites resonant oscillations defined by the effective capacitance of the split and the effective inductance along the SRR arms.

In light of the above, some embodiments of the nanopillar-based SRRs of the present disclosure can be regarded as an inductive-capacitive (LC) circuit, which has resonant responses to the incident wave. The displacement current ($I_d$) across vacuum or media between two conductors can be defined by the following equation:

$$I_d = -J_d \cdot A = -\frac{\omega \varepsilon A}{d} \cdot V_0 \sin \omega t \tag{1}$$

where $J_d$ is the displacement current density, $\omega$ is the angular resonant frequency, $\varepsilon$ is the permittivity of the space between the two conductors, d is the distance between the two conductors, $V_0$ is the magnitude of voltage between the two conductors, and t is time. Lastly, A is the interface area between two nanopillars; both the width (l) and the height H (identified in FIG. 1C) of the nanopillar affect this parameter. To prove the theory of nanopillar-based MMs driven by displacement current, transmission spectra were obtained for the nanopillar-based SRRs described above obtained using ANSYS HFSS (High Frequency Structural Simulator, version: 13.0.2) commercial software. As shown in FIG. 5, three different resonant modes ($\omega_1$: $1^{st}$, $\omega_2$: $2^{nd}$ and $\omega_3$: $3^{rd}$) are clearly observed based on the surface current distributions, which are the same surface current distributions as that of typical thin-film-based SRRs. It should be noted that this result confirms that resonant behaviors induced by displacement current between nanopillars act exactly as resonant behaviors induced by conduction current in typical thin-metal-film-based SRRs.

In some embodiments of the present disclosure, the nanopillar-based SRRs can be optimized by considering or characterizing the effect of physical conditions on the resonant behaviors using, for example, the HFSS simulator mentioned above. For example, nanopillar-based SRRs with nanogap sizes of d=25 nm, 30 nm and 35 nm can be characterized with a fixed height H of 500 nm and permittivity $\varepsilon$ of 9.8 representing $Al_2O_3$. Based on Equation (1), the inventors of the present disclosure have surmised that the magnitude of the displacement current ($I_d$) can be enhanced by decreasing the gap d between immediately adjacent nanopillars. This may lead to a stronger resonance, as evidenced reduced transmission at resonant dip as shown in the simulation results of FIG. 6A.

Figure 6B:
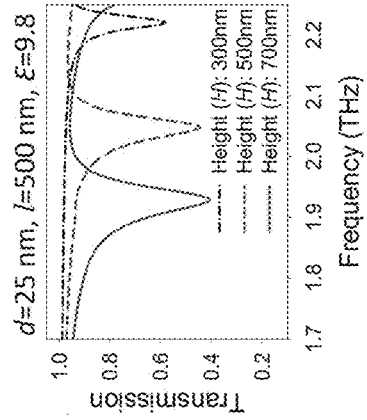
FIGS. 6A-6D are graphs of simulated transmission spectra of nanopillar-based SRRs in accordance with principles of the present disclosure.

The simulation results also indicate that the resonant frequency increases as nano-gap size increases. This result is explained by an increase of nanogap size d decreasing the capacitance (C) between nanopillars due to $C=\varepsilon \cdot A/d$. The resonant frequency is inversely proportional to $\sqrt{C}$, resulting in an increase in the resonant frequency (FIG. 6A). Second, the effect of different heights H of the nanopillars was examined with a fixed nano gap size d of 25 nm and a fixed permittivity of 9.8. As shown in FIG. 6B, the transmission amplitude of the nanopillar-based SRRs decreases as the height H gradually decreases from 700 nm to 300 nm. An increase of resonant frequency can also be observed with the decrease in height H (FIG. 6B). The change in height H directly affects the area A facing between nanopillars for a fixed nanopillar width l. Decreasing the height H reduces the area A, which leads to a decrease of displacement current ($I_d$) based on Equation (1) and a decrease in capacitance (C). Thus, the transmission amplitude at the resonant dip increases due to the weaker resonance with an increase in the resonant frequency. When the nanogap size increases to a certain value (critical gap, $d_c$), displacement current becomes too weak to support an LC resonance in the nanopillar SRRs, which results in the complete disappearance of resonant behaviors as reflected by FIGS. 6C and 6D. The critical gap size $d_c$ of nanopillar-based SRRs of the present disclosure also depends on the permittivity ($\varepsilon$) of the nanogaps (reflected by FIG. 6C) and the height H of nanopillars (reflected by FIG. 6D).

Figure 6D:
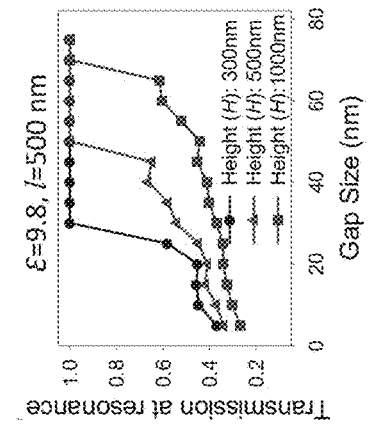
Figure 6A:
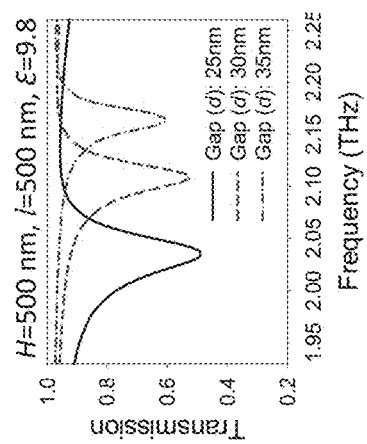
Figure 6C:
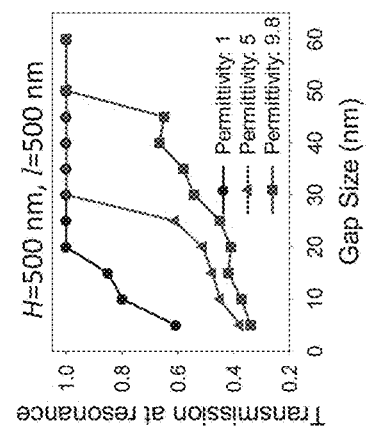

The results shown in FIGS. 6C and 6D agree well with the numerical expressions for the displacement current (Equation (1)). As shown in Equation (1), an increase in the permittivity ($\varepsilon$) allows enhanced displacement current with fixed height H=500 nm, leading to strong resonance in the SRRs (less transmission) (FIG. 6C). Therefore, SRRs with permittivity ($\varepsilon$) of 9.8 still show resonant behaviors at critical gap size ($d_c$=20 and 30 nm) unlike SRRs with $\varepsilon$=1 and 5. Similarly, as the height H of the nanopillars increases, the interface area A facing between nanopillars increases, leading to less transmissions due to the stronger resonance induced by increased displacement current $I_d$. The enhanced displacement current $I_d$ results in increased critical gap size $d_c$ (e.g., $d_c$ approximately 30 nm, 50 nm, and 70 nm for H=300 nm, 500 nm, and 1000 nm, respectively) with fixed $\varepsilon$=9.8 (FIG. 6D). Simulation results shown in FIGS. 6A-6D also exhibit features of the present disclosure that facilitate tuning the resonance of the nanopillar-based SRRs to achieve desired resonant frequencies and strong resonant behaviors.

Figure 7A:
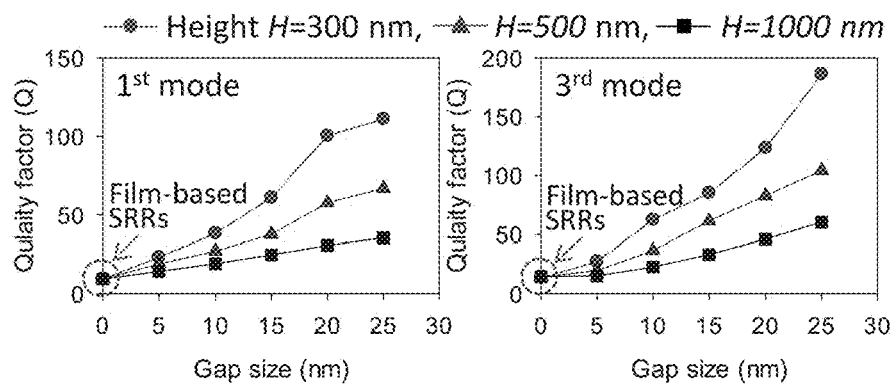
FIGS. 7A-7C are graphs of simulated Q-factors of nanopillar-based SRRs in accordance with principles of the present disclosure.
Figure 7B:
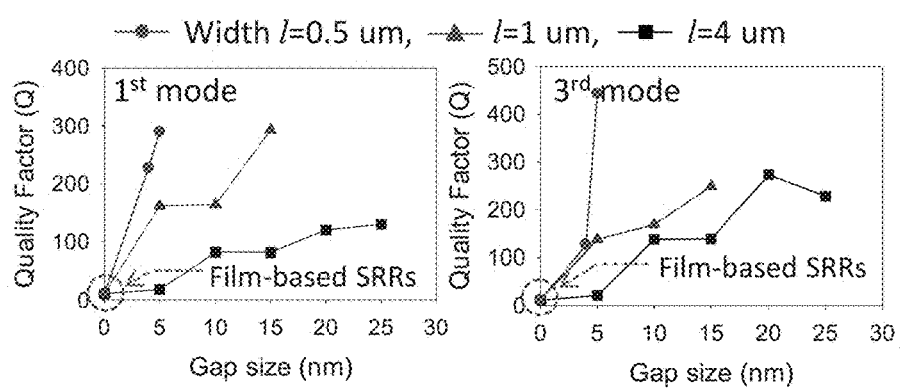
Figure 7C:
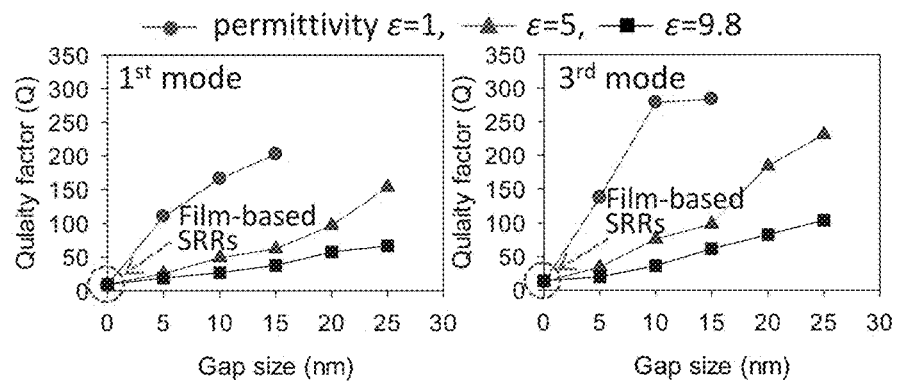

It should be noted that the Q-factor of the nanopillar-based SRRs in accordance with principles of the present disclosure is dramatically enhanced (more than 30 times), which offers high sensitivity. To analyze the effect of geometry and a property of materials on the Q-factor, SRRs with different physical conditions were characterized with respect to the size d of nano-gaps, and Q-factors were obtained from the simulation results of transmission spectra at both first mode ($\omega_1$) and third mode ($\omega_3$) at nanogap sizes of 5 nm to 25 nm for each simulation. As shown in FIGS. 7A-7C, height H (FIG. 7A) and width l (FIG. 7B) of the nanopillars, permittivity ($\varepsilon$) of species between nanogaps (FIG. 7C), and the nanogap size d strongly affect the Q-factor of nanopillar-based SRRs. As a point of reference, the Q-factors of thin-film-based SRRs (nanogap size=0 nm) are also presented in FIGS. 7A-7C. In all cases shown in FIGS. 7A-7C, Q-factors of the nanopillar-based SRRs increase with an increase of the nanogap size d, with d=0 indicating typical thin-film-based SRRs in the figure. This can be explained in terms of energy stored in the capacitors formed between the nanopillars inside the SRRs. The energy stored in a capacitor is defined as $U=q^2/2C$, where q is the electric charges on the capacitor and $C=\varepsilon \cdot A/d$ is the capacitance. Assuming that electric charges (q) formed on the surface of nanopillars is constant, energy stored in the SRRs (U) is inversely proportional to the capacitance ($C=\varepsilon \cdot A/d$) between each two nanopillars in the SRRs. The increase of nanogap size d decreases the capacitance (C), which results in the increase of the stored energy (U), thereby enhancing Q-factor. Both height H and width l of the nanopillars affect the interface area A facing between nanopillars. A decrease of height H or width l decreases the area A and the capacitance (C), which results in an increase of the energy stored (U) in the SRRs. Therefore, Q-factor increases with the decrease in height H (reflected by FIG. 7A) or width l (reflected by FIG. 7B). Similarly, the decrease of permittivity ($\varepsilon$) of materials between or within the nanogaps enhances the Q-factor of the nanopillar-based SRRs (reflected by FIG. 7C) because a decrease of the permittivity ($\varepsilon$) of the nano-gap reduces the capacitance (C), leading to more energy stored (U) in the SRR.

In some embodiments of the present disclosure, the Q-factors of nanopillar-based SRR MMs utilizing displacement current are enhanced to more than 300 and 450 at $1^{st}$ and $3^{rd}$ mode respectively (FIG. 7B), which is 33 and 32 times higher than that of thin-film-based typical SRRs (d=0, Q-factors of 9 and 14 at $1^{st}$ and $3^{rd}$ mode, respectively). Previous studies show that Q-factor of SRRs could be enhanced by breaking the symmetry of SRRs and introducing coupling between SRRs in an array. However, asymmetric SRRs and coupled SRR units always contain multiple splits with large split sizes, which are not suitable for biological and biomedical sensing given the small size of biological species. Also, multiple splits are not suitable for the localization of the species. With the techniques and devices of the present disclosure, Q-factor of nanopillar-based SRRs can be enhanced without changing the number of splits or the size of the split.

Figure 8A:
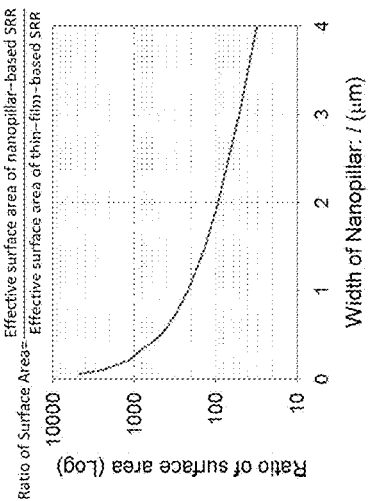
FIG. 8A is a schematic illustration of a nanopillar-based SRR in accordance with principles of the present disclosure and of a thin-film-based SRR.
Figure 8B:
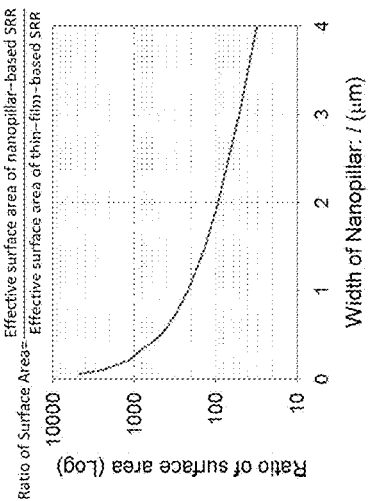
FIG. 8B is a graph comparing surface area ratios of nanopillar-based SRRs and thin-film-based SRRs.

Another factor that affects the sensitivity of SRRs is frequency shift. Larger frequency shift under a certain permittivity ($\varepsilon$) change around the SRRs means that even a small change of species can be easily detected. The inventors of the present disclosure have surmised that the significantly increased surface area A could induce large frequency shift, meaning high sensitivity, to a change of substance around the SRRs. Effective area of typical film-based SRRs is the surfaces at the split of the SRRs, which significantly affects resonant frequent shift. On the other hand, the effective surface area of nanopillar-based SRRs is the surface (sidewalls) of all the nanopillars forming the SRRs. The surface area of nanopillar-based SRRs is much larger than that of film-based SRRs. Furthermore, the effective surface area of nanopillar-based SRRs is enormously increased as the width l of the nanopillars decreases, which allows more nanopillars to fit into, for example, the SRR C-shape. By way of example, FIG. 8A illustrates that the effective surface area of thin-film-based SRRs is the side of area of the split, whereas the effective surface area of nanopillar-base SRRs in accordance with some embodiments of the present disclosure is the area of all the sidewalls of the nanopillars in the SRRs. The effective surface area of nanopillar-based SRRs is about 2500 times larger than that of typical thin-film-based SRRs when the width of the nanopillars is 100 nm as reflected by FIG. 8B (that otherwise shows the ratio of surface area between nanopillar-based SRRs and thin-film-based SRRs increases as the width (l) of the nanopillars decreases).

Figure 9A:
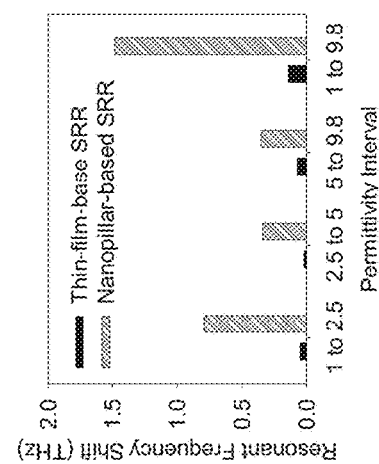
FIG. 9A is a graph of resonant frequency shift simulated in nanopillar-based SRRs in accordance with principles of the present disclosure and in thin-film-based SRRs.
Figure 9B:
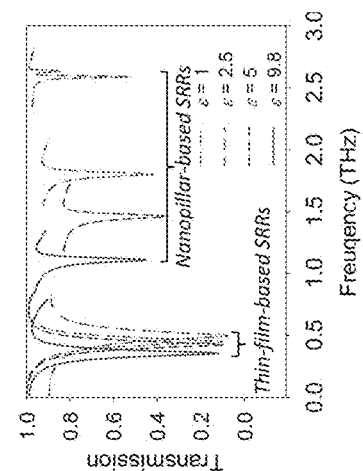
FIG. 9B is quantitative comparison (histogram) of the resonant frequency shift information of FIG. 9A.

With the above in mind, the resonant frequency ($\omega_1$) shift of transmission spectra of typical thin-film-based SRRs and nanopillar-based SRRs with a fixed height (H=500 nm), width (l=500 nm), and gap size (d=10 nm) were characterized using the HFSS simulator. As shown in FIG. 9A, the resonant frequencies of both nanopillar-based SRRs and film-based SRRs decrease as the permittivity ($\varepsilon$) of substance around the SRRs increases from 1 to 9.8. The resonant frequency shift of thin-film-based SRRs is only around 0.3 THz as the permittivity ($\varepsilon$) changes from 1 to 9.8. However, the resonant frequency shift of nanopillar-based SRRs is around 3 THz (10 times higher than that of the typical film-based SRRs). This is due to the significantly increased effective surface area. To quantitatively confirm the frequency shift of nanopillar-based SRRs and thin-film-based SRRs, in FIG. 9B the amounts of frequency shift associated with different permittivity intervals were redrawn from the results shown in FIG. 9A. The largest resonant frequency shift difference between nanopillar-based SRRs and thin-film-based SRRs happens when permittivity changes from 2.5 to 5 where the resonant frequency shift ($\Delta f_r$) of nanopillar-based SRRs is 0.34 THz, which is 17 times larger than the resonant frequency shift of thin-film-based SRRs ($\Delta f_r$=0.02 THz). The large frequency shift of nanopillar-based SRRs means that small changes in the permittivity of substance are significantly reflected in the resonant frequency change, which results in high detectability of minute substances. In addition, large resonant frequency shift shows the effective capability for the application of frequency-agile devices. Therefore, the nanopillar-based SRRs of the present disclosure can be highly beneficial for sensing applications as well as frequency-agile devices.

An additional, optional feature provided by some embodiment nanopillar-based SRRs of the present disclosure is selectivity. Selectivity can be a factor that affects the performance of THz MM sensors when multiple nonlinear substances are presented. Selectivity evaluates the ability of the sensor to detect one specific substance among multiple substances. Unlike sensitivity, in order to characterize the selectivity of the THz MM sensor, certain surface modifications of MMs need to be performed to enable selective binding between the targeted substance and the MMs. Large surface area and strong localized field created by nanogaps in the nanopillar-based MMs of the present disclosure can provide significant molecular absorption, which effectively increases the detection ability of the substance, leading to high selectivity. In addition, by precisely manipulating the nanogap size d, nanopillar-based MMs of the present disclosure can be used as size-based high selective sensors. When substances with different molecular sizes are exposed to the nanopillar-based MMs, only the substance with size smaller that the selected nanogap size can be presented (or "fit") in the nanogaps and thus contribute to the change in resonant frequency. Taking advantage of the ability to manipulate nanostructures on a nanoscale, nanopillar-based MM sensors of the present disclosure can be configured or utilized for biomedical sensing with high selectivity for example.

Methods of Manufacture

As indicated above, nanopillar-based MM devices of the present disclosure are optionally formed on a surface using a template, such as an AAO template. With this in mind, other aspects of the present disclosure are directed toward methods of forming an AAO template on a surface, and fabricating one or more vertically aligned nanowires on the surface using the so-formed AAO template. In this regard, the "nanowires" generated by the methods below can be the nanopillars associated with the nanopillar-based MM devices (e.g., SRRs), although other devices or structures for different end-use applications can also be generated by the methods described below. That is to say, the AAO template formation methods and corresponding nanowire fabrications methods via the AAO template described below are not limited to nanopillar-based MM devices, nanopillar-based SRRs, etc., describe above. Conversely, the nanopillar-based MM devices (e.g., nanopillar-based SRRs) can be fabricated by other methods that may or may not be directly implicated by the AAO template methods of manufacture below.

By way of background, there have been great advances in integrated circuit technology resulting in electronic devices with higher density and lower power consumption over the past four decades. As devices shrink in size to sub-100 nm scale, semiconductor nanowires receive great interest as the active component in future nanoscale circuits and devices in that the critical size, position, and density of the nanowires is well controlled during synthesis. However, current technology faces challenges with the integration of vertical semiconductor nanowires in circuits and devices, especially on the single nanowire level. Conventionally, substrates where vertical Si semiconductor nanowires are grown are limited to semiconductor substrates with {111} orientation using a CVD process. Otherwise, the growth direction of nanowires occurs randomly depending on the orientation of the substrate surface. However, for circuit integration, the nanowires should be formed on a metal surface. Currently, fabrication of thick anodic aluminum oxide (AAO) templates with patterning is of great interest since patterned porous alumina can be used as a template for vertically aligned patterned semiconductor and metal nanowire synthesis on a metal substrate. The synthesized nanowires, in turn, can be integrated into the development of biological and chemical sensors, semiconductor nanowire solar cell devices, and vertical 3D transistors.

The conventional way of patterning an AAO template, which involves wet or dry etching processes to make desired nanowire patterns, requires multiple lithographic processes. The problems with the conventional method are it leads to lifting and poor side wall quality of AAO template and involves multiple lithography process. Moreover, because the template usually requires a thick layer to form high aspect ratio porous structures, it is extremely hard to realize sub-micrometer scale nanowire patterns or a single nanowire with a high aspect ratio using conventional lithography processes.

With the above in mind, some aspects of the present disclosure provide novel AAO template formation methods, some examples of which are schematically illustrated in FIGS. 10A-10D. In general terms, and with initial reference to FIG. 10A, thin metal layer(s) are prepared onto a surface of interest 110. In the non-limiting embodiment of FIGS. 10A-10D, the surface of interest 100 is a silicon (Si) wafer, and the thin metal layers can include aluminum 120 (Al) (e.g., approximate 800 nm thickness), platinum (Pt) (e.g., approximately 40 nm thickness), and titanium (Ti) (e.g., approximately 5 nm thickness) thin film layers and are prepared on the silicon (Si) wafer 100 using an electron beam deposition process or other known technique. For ease of understanding, the exemplary Pt and Ti thin film layers are collectively identified by reference number 122. The Al surface 120 is coated with a negative photoresist (PR) 24, such as a negative tone photoresist available under the trade designation NR9-1500PY, from Futurrex, Inc. of Franklin, N.J., and a basic photolithography process is followed for a pattern transfer. As described below, some methods of the present disclosure utilize photoresist developers to etch the Al layer 120, so that there is no need to introduce any Al etchant for a pattern transfer on the Al surface 120. The developer makes resist patterns in the photoresist 124, and then starts to etch the aluminum layer 120 simultaneously during the developing process as reflected by FIG. 10B, resulting in regions (patterns) of varying thickness on the Al surface 120 as a function of the applied developer pattern. One so-formed trough 126 in the Al layer 120 is identified in FIG. 10B, and represents a region of the Al layer 120 that has been etched by the developer.

The photoresist 124 is then removed (e.g., with acetone) as reflected by FIG. 10C to allow porous structures to be form on (or in) the entire Al thin film 120. Next, the Al film 120, with surface height differences due to the patterning previously performed, is anodized and etched (thinning process) in, for example, oxalic acid (0.3M) and phosphoric acid (5%) accordingly. The heat energy generated from the reaction between Al and the acid solution can be utilized to form porous structures. Anodization time in oxalic acid is adjusted so as to allow the porous structures in the patterned (etched Al) regions to make direct contact with the Pt metal surface 122 while the other regions do not as shown in FIG. 10D. Stated otherwise, the anodization and thinning process generates porous structures in the Al film 120, initiating at an outer face 128 of the Al layer 120 and extending in a thickness direction. Because a thickness of the Al layer 120 is reduced at the previously-formed trough 126, the so-formed porous structures will extend to or contact the Pt metal surface 122 along the region of the trough 126 prior to any other region of the Al film 120. For example, FIG. 10D identifies complete pores 130 formed in a region of the trough 126 and projecting to the Pt metal surface 122, along with partial pores 132 formed in regions apart from the trough 126 and not projecting to (or open to) the Pt metal surface 122. The resultant AAO template 140 can then be subjected to an electroplating process for subsequent patterned nanowire (e.g., nanopillar) formation.

Additional methods of the present disclosure further include forming nanowires via the AAO template 140. For example, metal (e.g., gold (Au)) nanowires can be grown on the regions connected to the metal (Pt) surface 122 (i.e., the complete pores 130) using an electroplating process. Because the partial pores 132 are not open to the metal surface 122, nanowires will not be formed in or along the partial pores 132. Following formation of the nanowires, the AAO template 140 is removed (e.g., with 40% phosphoric acid), resulting in vertically aligned nanowires projecting from the metal substrate 122 that in turn is carried by the surface of interest 110.

Related methods of the present disclosure include forming a single vertically orientated nanowire on a metal substrate, such as a single vertically oriented semiconductor nanowire grown on a metal substrate. For example, and with reference to FIGS. 11A-11E, an AAO template 150 can be formed akin to the methods described above. Again, the aluminum thin layer or film 120 and the metal thin layer or film (e.g., Pt or Pt/Ti) 122 are formed on the surface of interest 110, such as a silicon wafer. The electron-beam lithography resist 124 is coated on to the Al layer 120 for nanoscale patterning, and then developed and etched to generate an etched pattern on the Al layer 120 (e.g., the trough 152 identified in FIG. 11A). The resist 124 is then removed. The pattern transferred onto the Al surface 120 can have a width of about sub-100 nm (FIG. 11B) in some embodiments. Electron beam lithography can be utilized to make a narrow pattern width. Subsequently, anodization and etching processes are performed as described above, resulting in the AAO template 150 of FIG. 11C. The heat energy generated from the reaction between Al and the acid solution can be utilized to form porous structures. As a point of reference, when there is not enough heat energy across the Al, which happens when anodization is performed on small area defined by the electron-beam lithography, the etch rate of the porous structure is significantly reduced. In fact, realization of a single porous structure with a selective area width of about 100 nm is not achievable using conventional techniques. Again, porous structures will form over the entire Al thin film 120. However, only a single complete porous structure 154 formed at the site of the etched pattern (i.e., the trough 152) initially made on the Al surface 120 will have direct contact with a bottom Pt metal layer 122 as reflected by FIG. 11C. Partial pores 156 are formed elsewhere in the Al layer 120, but are not open to or do not contact the Pt metal layer 122. With the AAO template 150 now formed, an Au catalyst layer 160 is deposited on the pattern at the complete pore or porous structure 154 using an electroplating process as shown in FIG. 11D. FIG. 11E illustrates that a CVD process (or other process) is then performed to grow a Si semiconductor (silicon) nanowire 162 on the Pt metal surface 122 using the patterned AAO template 150. The AAO template 150 can then be removed as described above.

Figure 12:
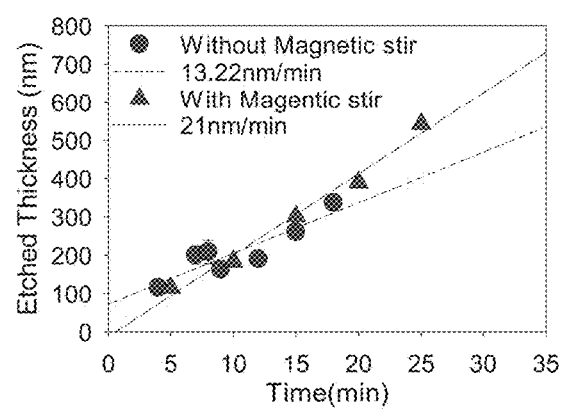
FIG. 12 is a graph of aluminum etch rates for a developer available under the trade designation "RD6" from Futurrex, Inc. of Franklin, N.J.
Figure 13A:
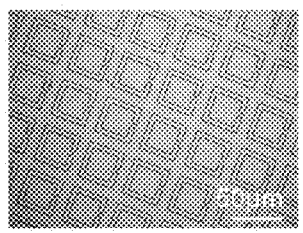
FIG. 13A is an optical microscope image of a pattern transferred on to a photoresist layer in accordance with principles of the present disclosure.
Figure 13B:
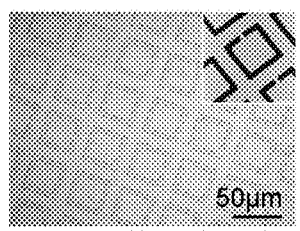
FIG. 13B is an optical microscope image of the pattern of FIG. 13A transferred onto an underlying aluminum surface following removal of the photoresist layer, with the insert of FIG. 13B providing an AFM image.
Figure 13C:
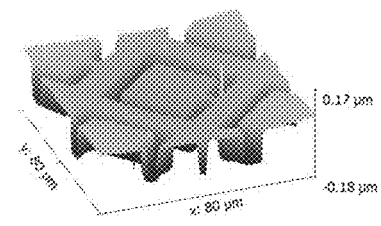
FIG. 13C is a three-dimensional AFM image of the patterned aluminum surface of FIG. 13B with depth around 170 μm.

As a point of reference, it is not well known that a photoresist developer will attack metals, especially Al with a high etch rate. Normally, ideal developers are configured to pattern only the photoresist layer. In accordance with some aspects of the present disclosure, however, a developer is selected that unintentionally attacks the Al surfaces underneath the photoresist or electron-beam resist layer(s) while developing the resist layer(s). For example, some developers of the present disclosure contain tetramethylammonium hydroxide (TMAH) as an active ingredient. One non-limiting example of a developer solution useful with the present disclosure and containing TMAH is available under the trade designation RD6 from Futurrex, Inc. of Franklin, N.J. TMAH is strong base which dissolves Al. The Al etch rate of the exemplary RD6 developer can be evaluated as follows. A 1 μm of Al thin film is deposited on a Si wafer with some regions covered with Al foil to prevent Al deposition to allow for step measurement. Al etch depth for various etch times were measured and analyzed to investigate the Al etch rate in the RD6 developer, and are reported in FIG. 12. The testing was conducted at room temperature. The rates of Al layer etching were found to be 21 nm/min and 13 nm/min with and without agitation using a magnetic stir, respectively. Even though developers contain a base solution as their active component which unintentionally attacks Al, the inventors of the present disclosure have surprisingly discovered that this property may be used to simplify the process of pattern transfer onto an Al surface in accordance with principles of the present disclosure because Al is patterned while developing the photoresist, eliminating the need for further introduction of an Al etchant. One non-limiting example of a patterned photoresist is shown in FIG. 13A, whereas FIGS. 13B and 13C show the etched Al formed according to the pattern during the developing process.

Embodiments and advantages of features of the present disclosure are further illustrated by the following non-limiting examples, but the particular materials and amounts thereof recited in these examples, as well as other conditions and details, should not be construed to unduly limit the scope of the present disclosure.

EXAMPLES

Nanopillar-Based MMs

Figure 14A:
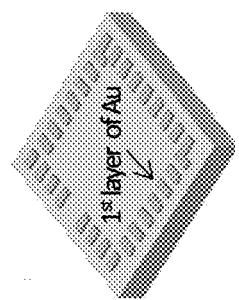
FIGS. 14A-14D schematically illustrate a fabrication method for slit-based SRR MMs.
Figure 14B:
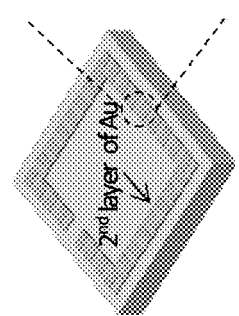
Figure 14C:
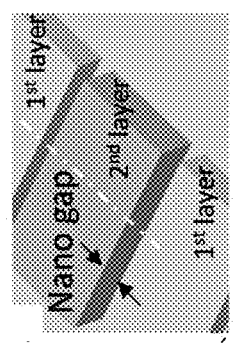
Figure 14D:
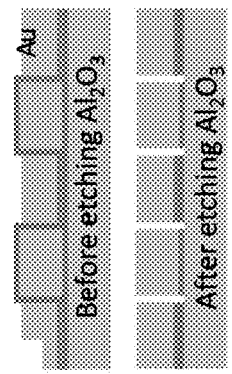

In order to experimentally demonstrate the resonant behavior driven by displacement current in nanopillar-based MMs of the present disclosure, slit-based SRR MMs were designed and fabricated. In some embodiments, the structures at opposite sides of the slit can be considered or formed as nanopillars, such that other aspects of the present disclosure are directed toward slit-based SRRs. The slit-based SRRs were made of gold (Au) and the slits were separated by either 10 nm thick $Al_2O_3$ ($\varepsilon=9.8$) or 10 nm air ($\varepsilon=1$) gaps. The basic concepts of slit-based SRRs and nanopillar-based SRRs are the same; they both use dielectric nanogaps where displacement current is induced between metals and flows through metal slits forming a SRR. FIGS. 14A-14D show the schematics of fabricated slit-based SRRs. Two layers of Au were deposited in sequence to create the nanogaps. First, a layer of 400 nm thick Au slits was patterned on a high-resistive (560-840 Ω·cm) silicon (Si) substrate by an electroplating process (FIG. 14A). Then 100 layers of $Al_2O_3$ were coated using an atomic layer deposition (ALD) system on the entire surface of the sample to define the 10 nm gap. A second layer of 300 nm thick Au slits was deposited between the first set of Au slits using the electroplating process (FIG. 14B). The electroplating process enabled the second layer of Au to completely fill the spaces between the first layer of Au slits without a void from the bottom to the top of the metal, which results in closely packed Au—$Al_2O_3$—Au sandwich structures (FIG. 14D). Both layers of Au slits had contact with the $Al_2O_3$ and thus the 10 nm $Al_2O_3$ layer defined the size of the nanogap between the Au slits after etching the $Al_2O_3$ layer (FIGS. 14C and 14D).

Figure 15A:
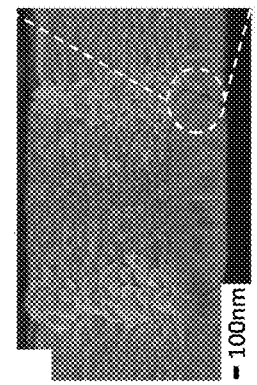
FIGS. 15A-15D are SEM images of a slit-based SRR array with 10 nm nano gaps between Au slits described in the Examples section.
Figure 15B:
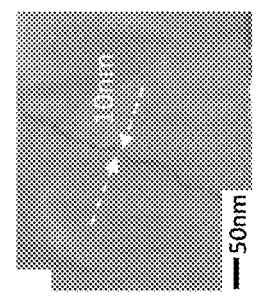
Figure 15C:
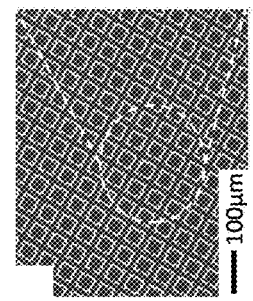
Figure 15D:
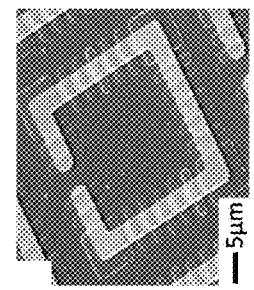

Since the ALD system allowed for easy control of the $Al_2O_3$ thickness with 0.1 nm (the thickness of one layer of $Al_2O_3$=0.1 nm) conformal coating, it is easy to realize 10 nm scale gaps between the thick metals with a high aspect ratio (as reflected by the SEM images of FIGS. 15A and 15B). The nanogap with high aspect ratio (height: 300 nm/width: 10 nm) cannot be realized with the use of currently available nanoscale lithographic processes such as electron beam and nano-imprint lithographic processes. For the last steps, the SRR C-shape was patterned using a second photolithography process and Au and $Al_2O_3$ outside of the C-shape pattern were etched away using an ion milling process (as reflected by the SEM images of FIGS. 15C and 15D). The 10 nm $Al_2O_3$ nanogaps were etched away at the end of the fabrication process using a selective wet etching process, resulting in 10 nm air gaps between Au slits (FIGS. 15A and 15B). FIGS. 15A-15D shows the scanning electron microscope (SEM) images of the fabricated slit-based SRR array defined on a high-resistive silicon substrate. The 10 nm gap between the two Au layers was clearly observed from the cross sectional SEM images (FIGS. 15A and 15B). A 5 nm gap was also realized.

Figures 16A, 16B:
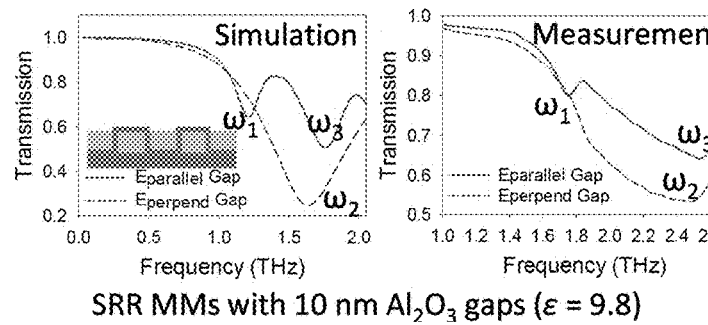
FIG. 16A is a graph of simulated transmission spectra of a slit-based SRR with 10 nm $Al_2O_3$ gaps of the Examples section.
FIG. 16B is a graph of measured transmission spectra of a slit-based SRR with 10 nm $Al_2O_3$ gaps of the Examples section.
Figures 16C, 16D:
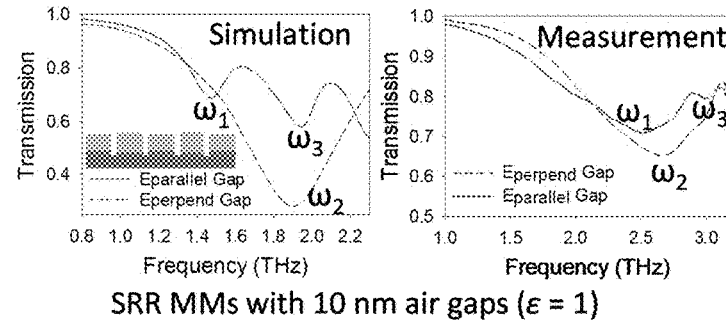
FIG. 16C is a graph of simulated transmission spectra of a slit-based SRR with 10 nm air gaps of the Examples section.
FIG. 16D is a graph of measured transmission spectra of a slit-based SRR with 10 nm air gaps of the Examples section.

Transmission spectra of the slit-based SRR samples were characterized by a simulator (FIGS. 16A and 16C) and terahertz time-domain spectroscopy (FIGS. 16B and 16D), with (FIGS. 16A and 16B) and without the $Al_2O_3$ layer (FIGS. 16C and 16D). For slit-based SRRs with 10 nm $Al_2O_3$ gaps, three resonant peaks are clearly seen in both simulation (FIG. 16A) and a measurement (FIG. 16B) which indicates first mode ($\omega_1$), second mode ($\omega_2$) and third mode ($\omega_3$) of the SRR. For slit-based SRRs with air gaps ($\varepsilon$=1), the three resonant peaks are also shown (FIGS. 16C and 16D). For both simulation and measurement results, the resonant frequencies of the slit-based SRRs with air gaps are higher than that of slit-based SRRs with $Al_2O_3$ gaps. This can be explained by the decrease of capacitance of the LC equivalent circuit due to the decrease of permittivity ($\varepsilon$). The reduced capacitance increases the resonant frequency of the SRR (FIGS. 16C and 16D). Unlike nanopillar-based SRRs, only 62 segments are applied in the resonators, yet a significantly increased Q-factor was observed; Q-factors of slit-based SRRs with $Al_2O_3$ are 38.6, which is 4.4 times higher than that of film-based SRRs (Q-factor=8.7). The resonant behaviors of slit-based SRR MMs experimentally observed match the simulation results, which fully supports features provided by the present disclosure (e.g., resonance driven by displacement current in SRR MMs) and further confirms the THz electromagnetic resonance in nanopillar-based SRR MMs AAO Template Fabrication Samples were prepared of vertically aligned Au nanowires on a metal substrate using the methods of the present disclosure, and in particular the steps described above with respect to FIGS. 10A-10D including the AAO template of the present disclosure. In particular, aluminum (approximately 800 nm)/platinum (approximately 40 nm)/titanium (approximately 5 nm) thin film layers were formed on a silicon wafer using an electron beam deposition. The aluminum surface was coated with a negative photoresist available under the trade designation NR9-1500PY from Futurrex, Inc. of Franklin, N.J., and basic photolithography was followed for a pattern transfer using a developer available under the trade designation RD6 from Futurrex, Inc. of Franklin, N.J. The photoresist was then removed and anodization performed in oxalic acid (0.3M) and phosphoric acid (5%) accordingly, creating porous structures over the entire surface of the aluminum layer, with the pores in the previously patterned aluminum layer coming in direct contact with the bottom metal layer. An SEM image of the porous structures formed on the entire aluminum surface while only the portions structures in the patterned portions touching or open to the bottom metal layer is provided in FIG. 17A. With the AAO template in place, electroplating was performed to grow Au nanowires. Only the porous structures in the region that was initially patterned have direct contact with the metal layer, thus current for Au electroplating only flowed in this region. The other regions which did not have contact with the metal layer were prevented from passing current due to the porous structure wall which is composed of $Al_2O_3$ which is insulator. As a result, Au nanowires were only realized on the patterned area as shown in SEM images of FIGS. 17B-17D. As a point of reference, the image of FIG. 17B depicts the patterned Au nanowires formed by electroplating. FIG. 17C depicts the Au nanowires pattern as a zoomed out image. FIG. 17D shows the patterned end of the Au nanowires.

It was surprisingly discovered that where an optimized anodization time is derived an applied to the AAO template fabrication process, most of the aluminum pores can reach the metal substrate, leading to a high yield. With the optimized anodization time, is was surprisingly found that an approximately 100% yield can be achieved. By way of further explanation, FIGS. 18A and 18B are images of nanowires produced by an AAO template formed under less than optimal anodization time conditions; the images reveal a relatively low yield. In comparison, FIGS. 19A and 19B are images of nanowires produced by an AAO template formed optimized anodization time conditions; the images reveal a very high yield.

Figure 20:
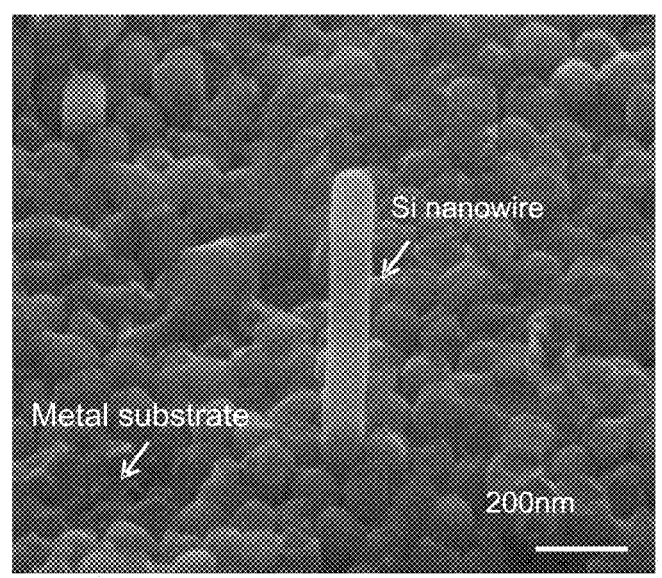
FIG. 20 is an SEM image of a single vertically aligned semiconductor (Si) nanowire described in the Examples section.

Other samples were prepared of a single vertically aligned semiconductor (Si) nanowire on a metal substrate using the methods of the present disclosure, and in particular the steps described above with respect to FIGS. 11A-11E including the AAO template of the present disclosure. The AAO template was prepared similar to the methods described above. The pattern was transferred using electron beam lithography, to make a pattern width around 100 nm. The Al surface was anodized as above, but only a single porous structure with a diameter around 100 nm which corresponds to the diameter of the pore structure was formed on the patterned Al area. Before anodizing an Al layer, the electron-beam resist layer was removed to induce enough heat energy during the anodization process. The anodization time was adjusted to allow for only a single porous structure to connect with bottom metal layer while other regions do not. Au catalysts approximately 100 nm thick were deposited on only the single pore via an electroplating method. The AAO template was then used to grow a single Si nanowire by a CVD process. After the AAO template was removed, a vertically oriented single Si nanowire grown on metal surface was provided. FIG. 20 is a SEM image of one the sample structures prepared, and shows a single vertically aligned semiconductor (Si) nanowire on a metal substrate.

The nanopillar-based Terahertz metamaterials (MMs) of the present disclosure provide a marked improvement over previous designs. Nanopillar-based THz MMs utilizing displacement current driving its resonant frequencies are enabled by the present disclosure and have been characterized. Forming the SRR with metal nanopillars or applying slits in the metal film induces displacement current along the nanopillar array or slits, which increases stored energy. This dramatically enhances Q-factor more than 30 times higher than that of typical thin-film-based SRR MMs. Enlarged effective surface area also increases resonant frequency shifts (e.g., 17 times) in response to substance changes around the resonators. Significantly enlarged Q-factor and large resonant frequency shifts improve sensitivity. Therefore, the nanopillar-based MMs are useful, for example, for ultra-sensitive biomedical and biomolecular sensors like label-free biosensors for sensing of DNA and protein, and biomolecular detectors of hormones and antigens. They can also be applied in highly sensitive chemical and gas sensing. In addition, the nanopillar-based MMs with large frequency shifts are suitable for frequency-agile devices such as spatial light modulators and tunable optical filters. Other end use applications are envisioned.

The methods of the present disclosure provided a marked improvement over previous techniques. In some embodiments, a fabrication method for vertically aligned patterned nanowires as well as a single semiconductor, i.e. silicon, nanowire is realized on a metal substrate using AAO templates with porous structures of differing heights dependent on lithographic patterning. This can be achieved by performing anodization on patterned Al where the patterned portions have an initial height difference relative to the unpatterned portions. In some embodiments, a developer that etches Al while patterning photoresist is employed. With some of the porous structures contacting the bottom metal layer following the previously applied pattern, metal (gold) and semiconductor (silicon) material can used to fabricate vertically aligned nanowires via, for example, electroplating deposition and a CVD process. With the methods of the present disclosure, fabrication of vertically aligned patterned nanowires becomes simpler and more cost effective. Further, they open up a new approach for the realization of a single vertically oriented semiconductor nanowire on a metal substrate, which leads to diverse applications in the areas of not only nanowire based sensors and field electron devices, but also devices such as 3D vertical transistors.

Although the present disclosure has been described with reference to preferred embodiments, workers skilled in the art will recognize that changes can be made in form and detail without departing from the spirit and scope of the present disclosure.

What is claimed is:

1. A terahertz metamaterial device comprising:
   a substrate;
   a conductive pattern formed on the substrate, the conductive pattern comprising a multiplicity of nanopillars;
   wherein the conductive pattern comprises a split ring resonator.

2. The terahertz metamaterial device of claim 1, wherein each of the nanopillars comprises a cross-sectional shape selected from the group consisting of a circle and a polygon.

3. The terahertz metamaterial of claim 1, wherein the nanopillars of the multiplicity of nanopillars are respectively formed of an electrically conductive material, and further wherein the substrate is formed of an electrically insulative material, and further wherein the nanopillars contact and extend directly from the substrate.

4. The terahertz metamaterial device of claim 1, wherein the split ring resonator is a single gap C-shape split ring resonator.

5. The terahertz metamaterial device of claim 1, wherein immediately adjacent ones of the nanopillars of the multiplicity of nanopillars of the split ring resonator are separated by a respective nanogap.

6. The terahertz metamaterial device of claim 5, wherein the size of each of the respective nanogaps is in the range of 1 to 40 nanometers.

7. The terahertz metamaterial of claim 5, wherein a size of each of the nanogaps is selected such that when electromagnetic waves are applied to the nanopillars, a transient electric field is induced between the nanopillars.

8. The terahertz metamaterial device of claim 1, wherein each of the nanopillars of the multiplicity of nanopillars comprises an electrically conductive metal.

9. The terahertz metamaterial device of claim 8, wherein the electrically conductive metal of each of the nanopillars is selected from the group consisting of gold and platinum.

10. The terahertz metamaterial device of claim 1, wherein the split ring resonator has a Q-factor of at least 300.

11. The terahertz metamaterial device of claim 1, wherein the conductive pattern further comprises a plurality of split ring resonators.

12. The terahertz metamaterial device of claim 1, wherein the terahertz metamaterial device is a sensor selected from the group consisting of a chemical sensor, a biological sensor, a temperature sensor, a strain sensor and a positioning sensor.

13. A method of making a terahertz metamaterial device, the method comprising:
   forming a multiplicity of nanopillars on a substrate;
   wherein the nanopillars combine to define a conductive pattern;
   wherein the conductive pattern includes a split ring resonator.

14. The method of claim 13, wherein immediate adjacent ones of the nanopillars of the multiplicity of nanopillars of the split ring resonator pattern are separated by a respective nanogap.

15. The method of claim 13, wherein the step of forming a multiplicity of nanopillars includes forming a template on the substrate.

16. The method of claim 15, wherein the step of forming a template includes:
   forming a metal layer on the substrate;
   coating an outer surface of the metal layer with a resist layer;
   applying a developer to develop a pattern in the resist layer, including the developer partially etching a region of the metal layer corresponding to the pattern;
   removing the resist layer; and
   after the step of removing the resist layer, anodizing the metal layer to form porous structures in the metal layer, wherein the porous structures formed in the etched region contact the substrate to define at least one complete porous structure and porous structures formed elsewhere along the metal layer do not contact the substrate.

17. The method of claim 16, wherein the metal layer comprises aluminum and the template is an anodic aluminum oxide template.

18. The method of claim 16, further comprising forming a nanopillar connected to the substrate at the at least one complete porous structure.

* * * * *